United States Patent [19]

Stanley

[11] Patent Number: 4,644,288
[45] Date of Patent: Feb. 17, 1987

[54] METHOD OF FAULT SENSING FOR POWER AMPLIFIERS HAVING COUPLED POWER STAGES WITH NORMALLY ALTERNATE CURRENT FLOW

[75] Inventor: Gerald R. Stanley, Mishawaka, Ind.

[73] Assignee: Crown International, Inc., Elkhart, Ind.

[21] Appl. No.: 689,922

[22] Filed: Jan. 9, 1985

[51] Int. Cl.[4] .............................................. H03F 3/04
[52] U.S. Cl. .................................... 330/2; 330/207 P; 330/298
[58] Field of Search ............... 330/2, 207 P, 298, 202, 330/270; 361/93, 101

[56] References Cited

U.S. PATENT DOCUMENTS 4,439,740 3/1984 Harrington .......................... 330/298
4,494,164 1/1985 Noel ................................... 330/298

Primary Examiner—Gene Wan
Attorney, Agent, or Firm—James D. Hall

[57] ABSTRACT

A method of fault sensing for a power amplifier having direct coupled power stages with normally mutually exclusive current flow in which the alternating current output is simultaneously sensed and, when a fault is detected, is ANDed. A power reduction to the amplifier is initiated when the ANDed output exists for a selected period of time.

10 Claims, 3 Drawing Figures

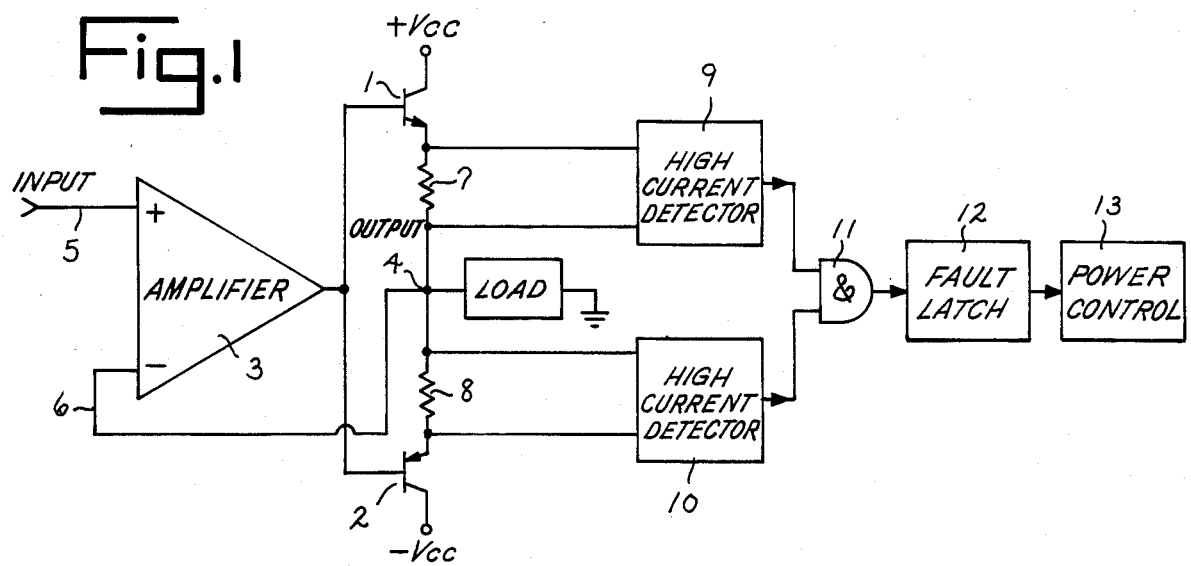
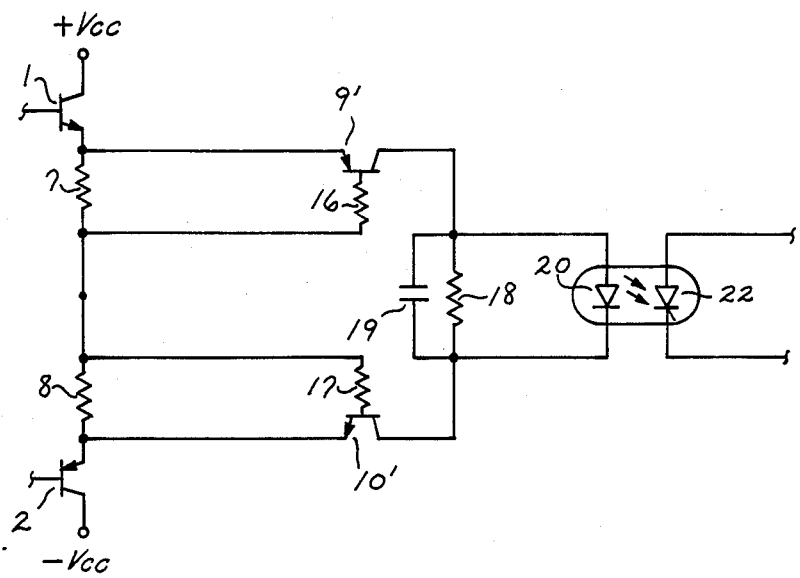
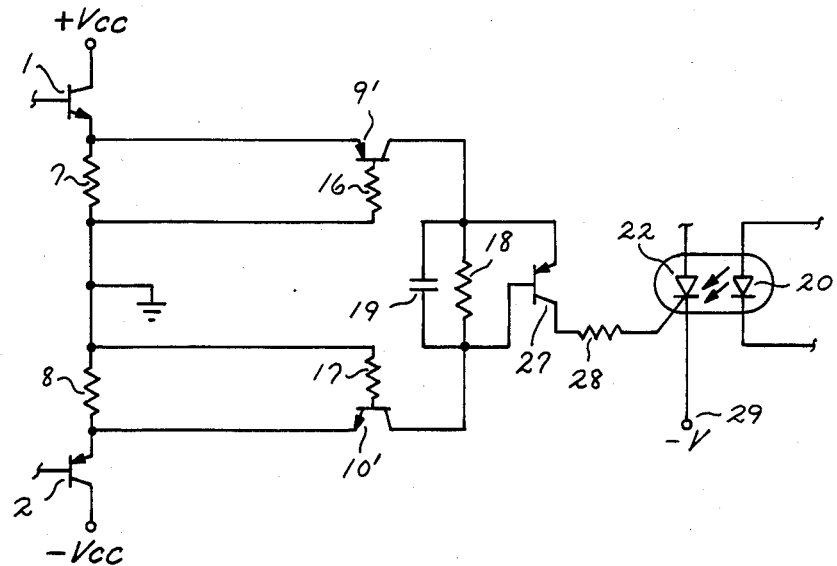

METHOD OF FAULT SENSING FOR POWER AMPLIFIERS HAVING COUPLED POWER STAGES WITH NORMALLY ALTERNATE CURRENT FLOW

SUMMARY OF THE INVENTION

Power amplifiers are generally made with their output stages directly coupled. Such stages produce alternating output currents. A critical factor in the efficient operation of such amplifiers is that the current output for any amplifier cannot be simultaneous in the output stages so as to produce a large amount of current for a relatively large time. Such common mode or simultaneous conduction of an amplifier may briefly exist as a large spike but, if sustained, can cause damage to the amplifier. In this invention, a method is described by which the alternating output of a power amplifier can be monitored so that any period of sustained common mode current output can be sensed and the power to the amplifier terminated. This is accomplished by simultaneously sensing the high alternating current output of the amplifier and ANDing the simultaneous sensed current output. The ANDed output is monitored with any sustained monitored output causing a fault latching or shutoff of the input power to the amplifier.

Accordingly, it is an object of this invention to provide a method of fault sensing of the power output of an amplifier having alternating output currents.

Another object of this invention is to provide an effective and efficient method of monitoring the alternating current output of a power amplifier and causing the power input to the amplifier to be terminated when any large amount of common mode current exists for a relative large length of time.

Other objects of this invention will become apparent upon the reading of the following description.

BRIEF DESCRIPTION OF THE DRAWINGS

FIG. 1 is a block diagram of the fault sensing method and its components shown connected to a power amplifier.

FIG. 2 is a circuit diagram of one embodiment of the circuitry to accomplish the fault sensing method of this invention.

FIG. 3 is a circuit diagram of another embodiment of the circuitry to accomplish the fault sensing method of this invention.

DESCRIPTION OF THE INVENTION

Preferred embodiments of this invention have been chosen for purpose of illustration and description wherein persons skilled in the art may accomplish and practice the invention.

Referring to FIG. 1, amplifier 3 having directly coupled output stages 1 and 2 is shown. Stages 1 and 2 normally alternate in conducting current and allow the production of alternating output currents. The amplifier 3 which drives output stages 1 and 2 responds through feedback line 6 to the output signal at 4 to the load and amplifies the input signal received at its input 5.

As mentioned previously, output stages 1 and 2 are designed to normally alternate in conducting current. The simultaneously conduction of stages 1 and 2 to produce a common mode current cannot take place for any large amount of time. While such common mode current can exist very briefly as a large spike, if such a current is sustained, damage can occur to the amplifier or to other components of the system being driven by the amplifier. One manner in which a sustained common mode current could occur would be the occurrence of a short in stage 1 which will produce a positive signal at output 4 due to the +Vcc. This produces an output error when sensed by the amplifier and its feedback, results in stage 2 being driven to turn and to counter the erroneous output produced by the shorting or faulting of stage 1. As a consequence, a large current will flow through resistors 7 and 8 between the +Vcc and −Vcc supplies.

Such a fault can be monitored and corrected in the following manner. A high current detector 9 connected across resistor 7 between stage 1 and output 4 and a high current detector 10 connected across resistor 8 between stage 2 and output 4 will each simultaneously send a signal to an AND gate 11 to produce a combined output. During normal operation, gate 11 will output no signal or current. During a fault or common mode current situation, each detector 9 and 10 will pass a current to gate 11 which will output a signal or current. A built-in delay of the current output of gate 11 to a fault latch 12 allows brief spikes of common mode current which may be permissible and will not harm the system. Once a sustained, common mode current is detected and gate 11 outputs to fault latch 12, the latch 12 is locked or latched to disable the connected power supplies to stages 1 and 2 through a power control 13. After once latched, the fault latch is not allowed to be automatically reset upon removal of power to stages 1 and 2. A typical delay at gate 11 to allow for permissible brief current spikes would be in the range of 10 microseconds. This time period of delay is generally faster than power can be removed from stages 1 and 2 through the operation of power control 13 and, therefore, the integrity of the fault system is not compromised. Referring to FIGS. 2 and 3, two embodiments for accomplishing the fault sensing and latching are shown in disconnected form from amplifier 3 and its load for illustrative purposes.

In FIG. 2, the function of current detectors 9 and 10 is provided by a PNP transistor 9' and a NPN transistor 10'. An impedance, namely resistors 16 and 17, is provided to prevent damage to the base-emitter junctions of transistors 9' and 10' upon high current output. The AND gate 11 function is provided by the series connection of the collectors of transistors 9' and 10'. The function of fault latch 12 is provided by an optically coupled light emitting diode 20 and a SCR 22. Power control 13 which may be a suitable switching device (not shown) controlling the power to output stages 1 and 2 is enabled by the voltage across the anode and cathode of SCR 22. An impedance or resistor 18 is connected in series between the collectors of transistors 9' and 10'.

Upon common mode current flow between transistors 9' and 10' and through resistor 18, an output voltage across the resistor is created to excite the opto-emitter or diode 20 which in turn latches SCR 22 on to activate power control 13 to turn off the power to stages 1 and 2. SCR 22 will remain latched on until its source of anode current is turned off. The delay function preferably required to accommodate brief permissible current spikes is accomplished by a capacitor 19 being connected in parallel across resistor 18. Capacitor 19 delays the attainment of a sufficient voltage across resistor 18 to excite or turn on the light emitting diode 20.

In FIG. 3, the fault sensing circuit is modified to accommodate a grounded stage amplifier output. The optical isolation produced by diode 20 relative to SCR 22 is not generally required in grounded output stages. Therefore, the role of SCR 22 and diode 20 can be reversed in the interconnection between power control 13 and transistors 9' and 10'. In this circuit, SCR 22 is connected to power control 13 and a PNP transistor 27 is utilized to provide the threshold delay effect that is provided by diode 20 in the circuit of FIG. 2. The base and emitter of transistor 27 is connected across resistor 18. The collector of transistor 27 is connected through resistor 28 to the gate of SCR 22. Resistor 28 is utilized to provide current protection to the gate of SCR 22. In order for the base-collector junction of transistor 27 to be continuously reversed-biased, SCR 22 is powered from a negative supply 29. In the circuits of FIGS. 2 and 3, the normally encountered common mode currents are not large enough to allow the voltages induced upon resistors 7 and 8 to exceed the forward bias of base-emitter voltages of transistors 9' and 10'. Resistors 7 and 8 are selected such that currents larger than acceptable common mode currents do produce voltages that exceed the forward bias of base-emitter voltages of transistors 9' and 10'.

In the circuit of FIG. 3, the common mode current through resistor 18 turns transistor 27 on which in turn latches on SCR 22. Upon turn on of SCR 22, power control 13 is activated to turn off the power to stages 1 and 2. In this circuit, capacitor 19 serves the same delaying function as it does in the FIG. 2 circuit to allow for permissible current spikes.

It is to be understood that the optical isolation function of diode 20 and SCR 22 which allows isolation between the large output voltages or currents from stages 1 and 2 and the power control circuitry need not be integrated physically within the same fault latch. Optical isolaters could be easily used to couple the fault signal to a conventional TTL flip-flop. Additionally, multiple inputs can be made to the fault latch 12 from other faulted portions of the power circuitry in order to combine the power cutoff for other types of fault monitoring purposes. The circuits of FIGS. 2 and 3 can be used with a single SCR-LED (such as items 22 and 20) to monitor both the high and low sides of a grounded bridge amplifier such as found in U.S. Pat. No. 3,808,545.

It is to be understood that the invention is not to be limited to the details above given but may be modified within the scope of the appended claims.

I claim:

1. A method of fault sensing for a power amplifier having directly coupled power stages with normally alternate current flow output comprising the steps of:
   a. Sensing simultaneously the individual output currents of each of said stages; and
   b. Detecting a fault when all said simultaneously sensed output currents exceed a specific maximum.

2. A method of fault protection for a power amplifier having directly coupled power stages with normally alternate current flow comprising the steps of:
   a. sensing simultaneously the individual output currents of each said stages;
   b. Detecting a fault when all said simultaneously sensed output currents exceed a specific maximum; and
   c. Initiating a power termination to said stages in response to detecting said fault.

3. The method of claim 2 and including the step of delaying initiating said power termination to accomodate permissible spikes of said sensed output currents which exceed said maximum.

4. In combination, a fault protection circuit and a power amplifier having two directly coupled power stages each having an input and an output in series with an impedance with normally alternate current flow, comprising two transistors each connected at its base and emitter in parallel across said power stage impedance, said transistors connected together at their collectors in series with a resistor, an optically coupled fault latch means connected in parallel across said resistor and responsive to a selected voltage across said resistor created by said current flow in a common mode for reducing the input into said power stages when said selected voltage occurs.

5. The combination fault protection circuit and power amplifier of claim 4 wherein said fault latch means includes a light emitting diode connected in parallel with said resistor and a SCR photo coupled to said diode.

6. The combination fault protection circuit and power amplifier of claim 5 and a capacitor means connected in parallel across said resistor for delaying the attainment of said selected voltage across said resistor to accomodate permissive common mode current spikes.

7. The combination fault protection circuit and power amplifier of claim 4 wherein said fault latch means includes a transistor connected in parallel at its emitter and base to said resistor, a SCR having its gate connected to said last mentioned transistor at its collector.

8. The combination fault protection circuit and power amplifier of claim 7 and a capacitor means connected in parallel across said resistor for delaying the attainment of said selected voltage across said resistor to accomodate permissive common mode current spikes.

9. The combination fault protection circuit and power amplifier of claim 7 and a light emitting diode photo coupled to said SCR.

10. The method of claim 2 wherein the power reduction of step C includes a reduction of power to the amplifier in response to detecting a fault.

* * * * *